United States Patent
Antony et al.

(10) Patent No.: US 10,168,386 B2
(45) Date of Patent: Jan. 1, 2019

(54) SCAN CHAIN LATENCY REDUCTION

(71) Applicant: International Business Machines Corporation, Armonk, NY (US)

(72) Inventors: George Antony, Cochin (IN); Mary P. Kusko, Hopewell Junction, NY (US); Sridhar H. Rangarajan, Bangalore (IN); Shrinivas Shenoy, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 15/405,481

(22) Filed: Jan. 13, 2017

(65) Prior Publication Data

US 2018/0203064 A1 Jul. 19, 2018

(51) Int. Cl.
*G01R 31/28* (2006.01)
*G01R 31/317* (2006.01)
*G01R 31/3177* (2006.01)

(52) U.S. Cl.
CPC ... *G01R 31/31725* (2013.01); *G01R 31/3177* (2013.01); *G01R 31/31707* (2013.01)

(58) Field of Classification Search
CPC .......... G01R 31/31725; G01R 31/3107; G01R 31/3177; G01R 31/318536; G01R 31/318558; G01R 31/318544; G01R 31/318335; G01R 31/318385; G01R 31/318547; G01R 31/318552; G01R 31/318572; G06F 1/3203; G06F 11/267
See application file for complete search history.

(56) References Cited

U.S. PATENT DOCUMENTS

| | | | |
|---|---|---|---|
| 5,745,724 A | 4/1998 | Favor et al. |
| 5,881,261 A | 3/1999 | Favor et al. |
| 6,795,944 B2 | 9/2004 | Barnhart |
| 6,928,606 B2 | 8/2005 | Svaria et al. |
| 7,464,311 B2 | 12/2008 | Larson et al. |
| 7,707,472 B1 | 4/2010 | Dastidar |

(Continued)

FOREIGN PATENT DOCUMENTS

JP    4684829 B2    5/2011

OTHER PUBLICATIONS

Antony et al., "Scan Chain Latency Reduction", U.S. Appl. No. 15/807,834, filed Nov. 9, 2017, 21 pages.

(Continued)

*Primary Examiner* — Guerrier Merant
(74) *Attorney, Agent, or Firm* — Edward J. Wixted, III (57) ABSTRACT

A method, executed by a computer, includes receiving a scan chain design comprising a plurality of parallel scan chains, each parallel scan chain comprising one or more serially connected single-bit registers, each parallel scan chain having a scan chain length. The plurality of parallel scan chains are interspersed with a plurality of stumpmuxes that enable access to the plurality of parallel scan chains and segment each parallel scan chain into a plurality of scan chain segments. The method further includes conducting a determining operation comprising determining a parallel scan chain having a longest scan chain length, and conducting a swapping operation comprising swapping scan chain segments attached to a selected stumpmux to reduce the longest scan chain length and produce an updated scan chain design. A computer system and computer product corresponding to the above method are also disclosed herein.

18 Claims, 5 Drawing Sheets

(56) References Cited

U.S. PATENT DOCUMENTS

| | | |
|---|---|---|
| 7,779,322 B1 | 8/2010 | Wang et al. |
| 7,823,035 B2 | 10/2010 | Litten et al. |
| 7,987,400 B2 | 7/2011 | Berry et al. |
| 8,539,292 B2 | 9/2013 | Nieuwland et al. |
| 8,793,546 B2 | 7/2014 | Tekumalla et al. |
| 8,839,181 B2 | 9/2014 | Liu et al. |
| 8,875,071 B2 | 10/2014 | Wang et al. |
| 8,914,695 B2 | 12/2014 | Gizarski |
| 9,041,411 B2 | 5/2015 | Marinissen et al. |
| 2015/0276869 A1 | 10/2015 | Sofer et al. |

OTHER PUBLICATIONS

IBM Appendix P, list of patents and patent applications treated as related, filed herewith, 2 pages.

SCAN CHAIN LATENCY REDUCTION

BACKGROUND

The present invention relates generally to the field of integrated circuits, and more particularly to testing integrated circuits.

Scan chains are chains of single-bit registers (e.g., flip-flops or latches) that can be used as data inputs and outputs for functional units in order to facilitate testing of the functional units. Scan chains are typically loaded with test data and unloaded with results data via a serial interface. For example, Wikipedia describes the following sequence for scan chains: 1) assert scan mode and set up the desired inputs, 2) de-assert scan mode and apply one clock to capture results in the target flip-flops, 3) re-assert scan mode, and see if the combinatorial test passed.

SUMMARY

A method, executed by a computer, includes receiving a scan chain design comprising a plurality of parallel scan chains, each parallel scan chain comprising one or more serially connected single-bit registers, each parallel scan chain having a scan chain length. The plurality of parallel scan chains are interspersed with a plurality of stumpmuxes that enable access to the plurality of parallel scan chains and segment each parallel scan chain into a plurality of scan chain segments. The method further includes conducting a determining operation comprising determining a parallel scan chain having a longest scan chain length, and conducting a swapping operation comprising swapping scan chain segments attached to a selected stumpmux to reduce the longest scan chain length and produce an updated scan chain design. A computer system and computer product corresponding to the above method are also disclosed herein.

DETAILED DESCRIPTION

The embodiments disclosed herein recognize that scan chains can be used for a variety of purposes and that using different scan chain types for different purposes may reduce the effective scan chain length to conduct needed testing and/or obtain needed information. Examples of scan chain types include types for functional testing, clock tuning, array repair, and the like.

The embodiments disclosed herein also recognize that reducing the length of each scan chain type reduces the latency associated with that particular scan chain type.

Figure 1:
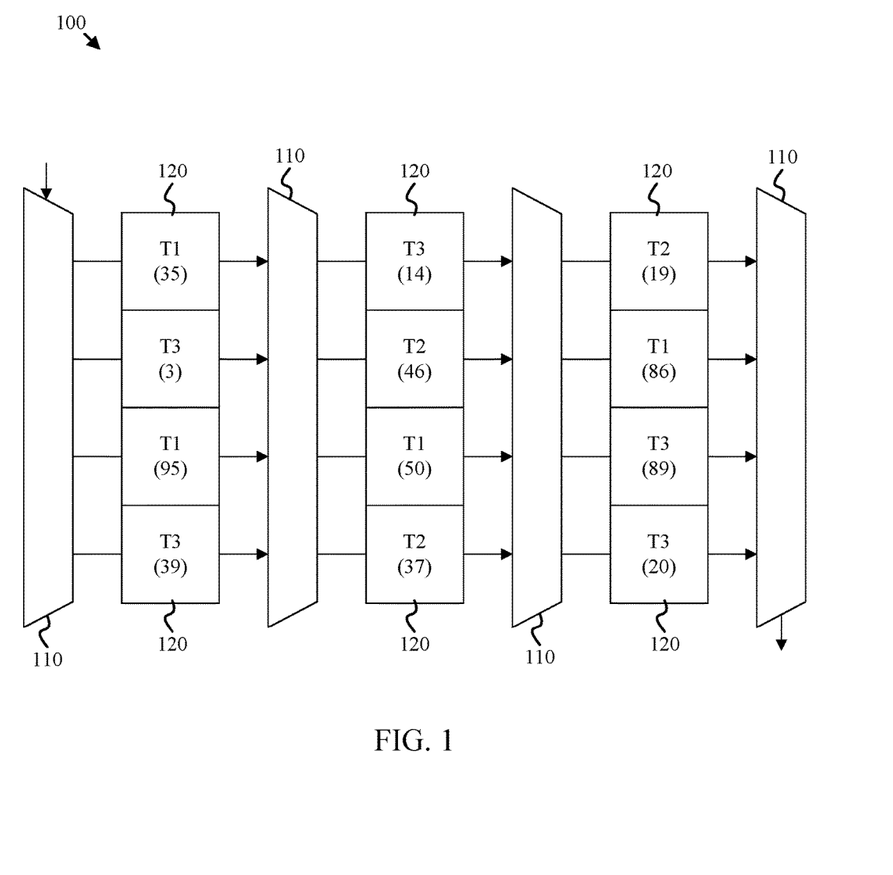
FIG. 1 is a block diagram of a simplified example of a scan chain design to which at least one embodiment disclosed herein may be applied.

FIG. 1 is a block diagram of a simplified example of a scan chain design 100 to which at least one embodiment disclosed herein may be applied. As depicted, the scan chain design 100 includes a number of stumpmuxes 110 interconnected with scan chain segments 120. Each of the scan chain segments 120 are shown as a single functional block and are annotated with a type identifier (i.e., 'T1', 'T2', or 'T3') and a bit length (shown in parenthesis). Inclusion of the last stumpmux within the architecture shown in FIG. 1, and similar scan chain architectures, is optional. For the depicted example, the bit lengths and type identifiers were randomly selected to communicate how at least some of the embodiments disclosed herein can optimize a design.

Each scan chain segment 120 is connected to the same bit position of the stumpmuxes to which it is connected. Segments that have a particular type identifier are separately activated from segments with different type identifiers. Consequently for each scan chain type, the total length of a scan chain at each bit position is the sum of the lengths of the scan chain segments of that type. For example, the third bit position of the above design has a scan length of 95+50=145 for type 'T1', zero for type 'T2', and 89 for type 'T3'.

At least some of the embodiments disclosed herein leverage the use of different scan chain types to simplify the optimization process. Furthermore, at least some of the embodiments disclosed herein are compatible with, and will not degrade, other optimization approaches.

Figure 2:
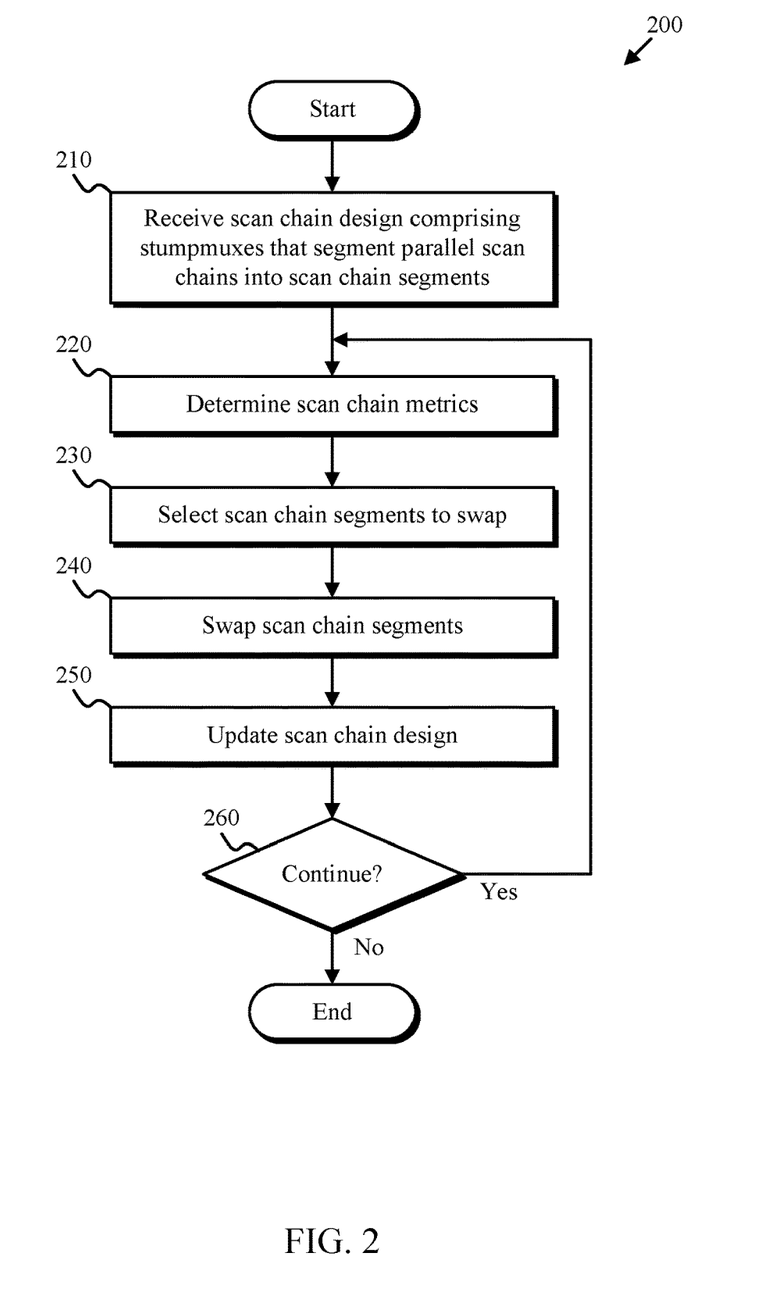
FIG. 2 is a flowchart depicting one example of a scan chain optimization method in accordance with at least one embodiment disclosed herein.

FIG. 2 is a flowchart depicting one example of a scan chain optimization method 200 in accordance with at least one embodiment disclosed herein. As depicted, the scan chain optimization method 200 includes receiving (210) a scan chain design, determining (220) one or more scan chain metrics, selecting (230) scan chain segments to swap, swapping (240) the scan chain segments, updating (250) the scan chain design, and determining (260) whether to continue.

Receiving (210) a scan chain design may include may include receiving a design file or data structure that specifies the topology (interconnection structure) of a scan chain. The design file may conform to an industry standard such as VHDL or verilog.

Determining (220) one or more scan chain metrics may include determining the length of each scan chain and each scan chain segment in the scan chain design. Selecting (230) scan chain segments to swap may include selecting two scan chain segments that when swapped will reduce the length of the longest scan chain of a particular scan type. Each of the selected scan chain segments may be attached to, and reside between, two particular stumpmuxes.

Swapping (240) the scan chain segments may include exchanging the bit positions of the selected scan chain segments. Updating (250) the scan chain design may include making changes to an electronic file or data structure that defines the scan chain design. Determining (260) whether to continue may include determining whether additional optimization is desired and possible. If so, the method loops to the determining step 220. If not, the method exits.

Figure 3A:
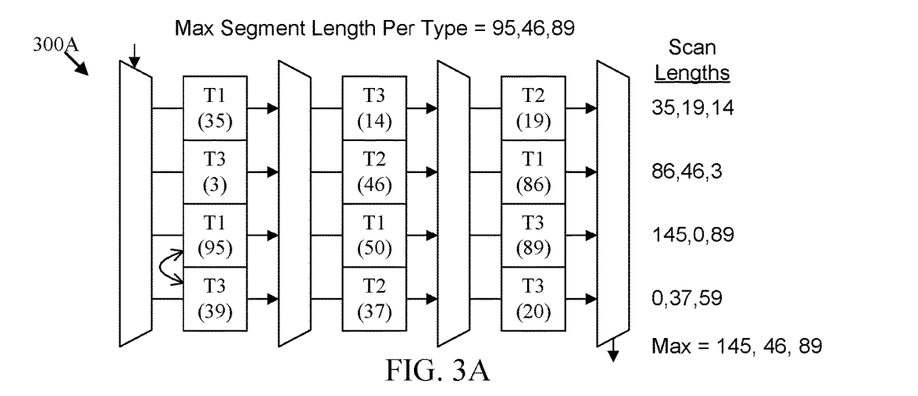
FIGS. 3A-3C are block diagrams depicting the scan chain design of FIG. 1 at specific stages of optimization using one embodiment of the method of FIG. 2.
Figure 3B:
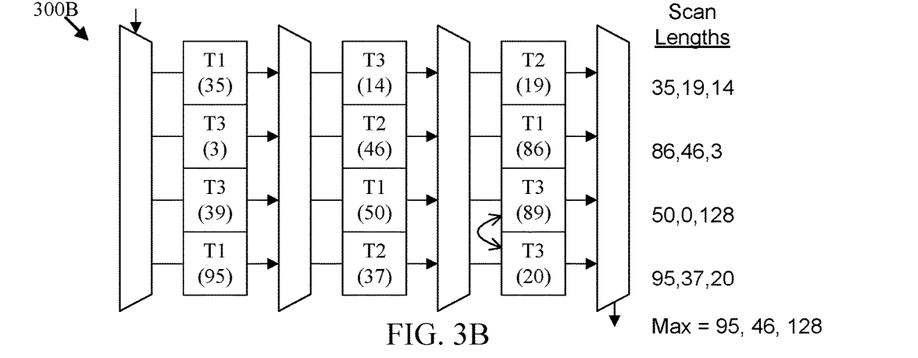
Figure 3C:
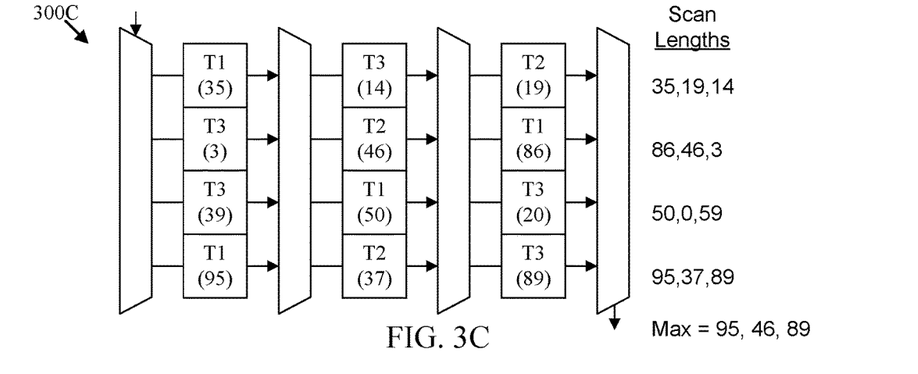

FIGS. 3A-3C are block diagrams depicting the scan chain design 100 of FIG. 1 at specific stages of optimization using one embodiment of the method 200 depicted in FIG. 2. As shown in FIG. 3A, the longest scan chain for type 1, with a length of 145 bits, is the third scan chain. The shortest scan chain for type 1 is the fourth (i.e., bottom scan chain) scan chain with a length of 0 bits. Furthermore, by swapping the segments attached to the first and second stumpmuxes that correspond to the third and fourth scan chains, the longest scan chain for type 1 is reduced from 145 bits to 95 bits as shown in FIG. 3B.

Additional searching of possible swaps reveals that swapping the type 3 segments attached to the third and fourth stumpmuxes in the third and fourth scan chains reduces the longest type 3 scan chain from 128 bits to 89 bits as shown in FIG. 3C. Further searching of possible swaps reveals that no more swaps are available that would reduce the longest scan chains for each scan chain type. Consequently, the design in FIG. 3C is an optimal design.

Figure 4:
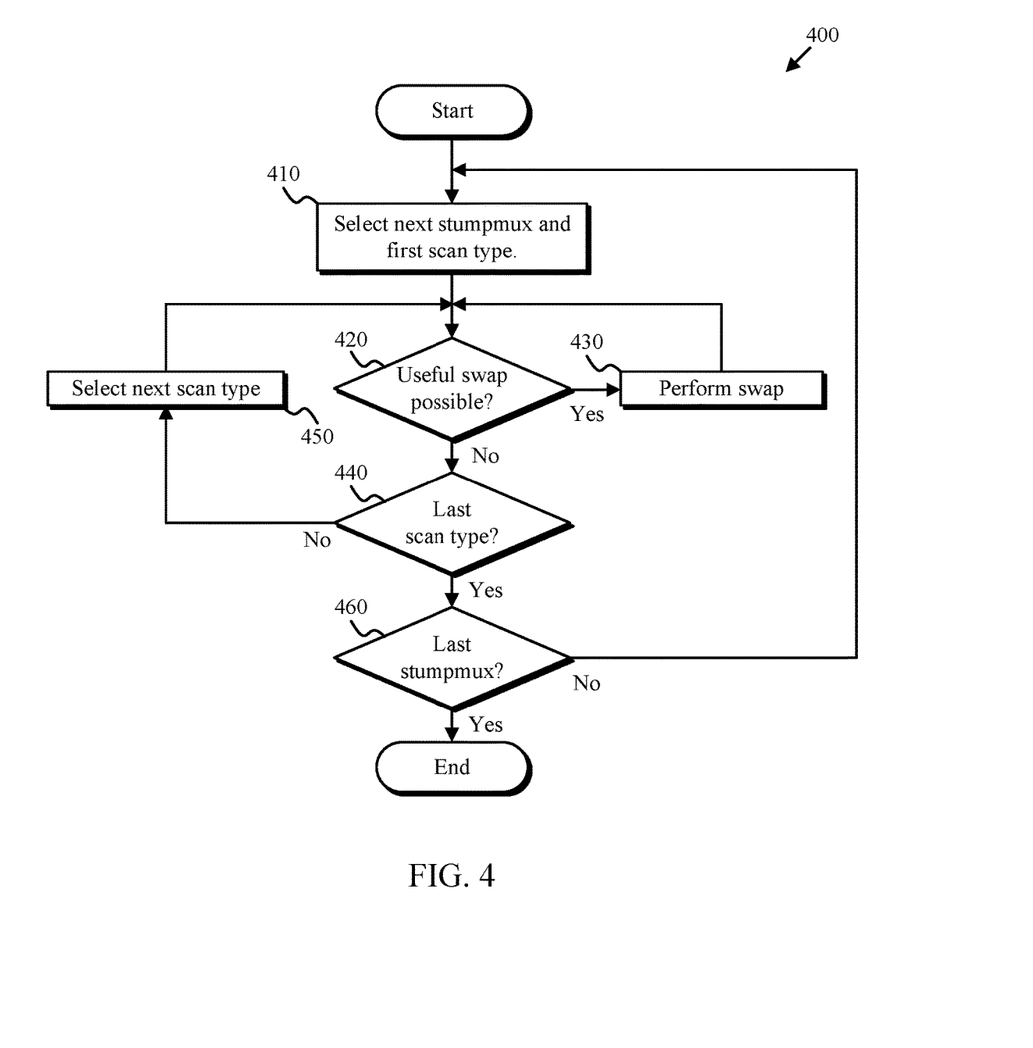
FIG. 4 is a flowchart depicting one example of a scan segment selection method in accordance with at least one embodiment disclosed herein.

FIG. 4 is a flowchart depicting one example of a scan segment selection method 400 in accordance with at least one embodiment disclosed herein. As depicted, the scan segment selection method 400 includes selecting (410) a next stumpmux, determining (420) whether a useful swap is possible, performing (430) a swap, determining (440) whether the last scan type has been processed, selecting (450) the next scan type, and determining (460) whether the last stumpmux has been processed. The scan segment selection method 400 may be conducted in conjunction with the selection operation 240 depicted in FIG. 2.

Selecting (410) a next stumpmux may include selecting the next stumpmux in the scan chain for (input or output) segment optimization. For example, the stumpmuxes may be arranged in the manner shown in FIG. 1 and sequentially selected from left to right for optimization. In one embodiment, a stumpmux index is used to track the current stumpmux for which input or output segments are being optimized. In another embodiment, rather than sequential selection a next stumpmux is selected by determining a stumpmux that has a largest difference in scan chain segment lengths for segments having a common scan chain type. In some embodiments, optimization occurs for the (input or output) segments of stumpmuxes in scan type order.

Determining (420) whether a useful swap is possible may include assessing the decrease in scan chain length that would occur in swapping a segment corresponding to the longest scan chain for a particular scan chain type with other (input or output) segments. Each of the segments may be attached to two adjacent stumpmuxes. If no decrease can be found the method continues to step 440. If a decrease can be found the method advances to performing (430) a swap.

Performing (430) a swap may include swapping the scan chain segments that result in a reduction in scan chain length for the selected scan chain type. In one embodiment, the segments that result in the greatest reduction in scan chain length are swapped by swapping the bit position of those segments between the two adjacent stumpmuxes. Determining (440) whether the last scan type has been processed may include testing a current scan chain type index against a maximum value. If the maximum value has been exceeded, the method advances to the determining operation 460. If the maximum value has not been exceeded, the method continues to the determining operation 460.

Selecting (450) the next scan type may include incrementing the current scan chain type index. Determining (460) whether the last stumpmux has been processed may include comparing the stumpmux index against a maximum value. If the maximum value has not been exceeded, the method loops to the selecting operation 410. If the maximum value has been exceeded, the method exits.

Figure 5:
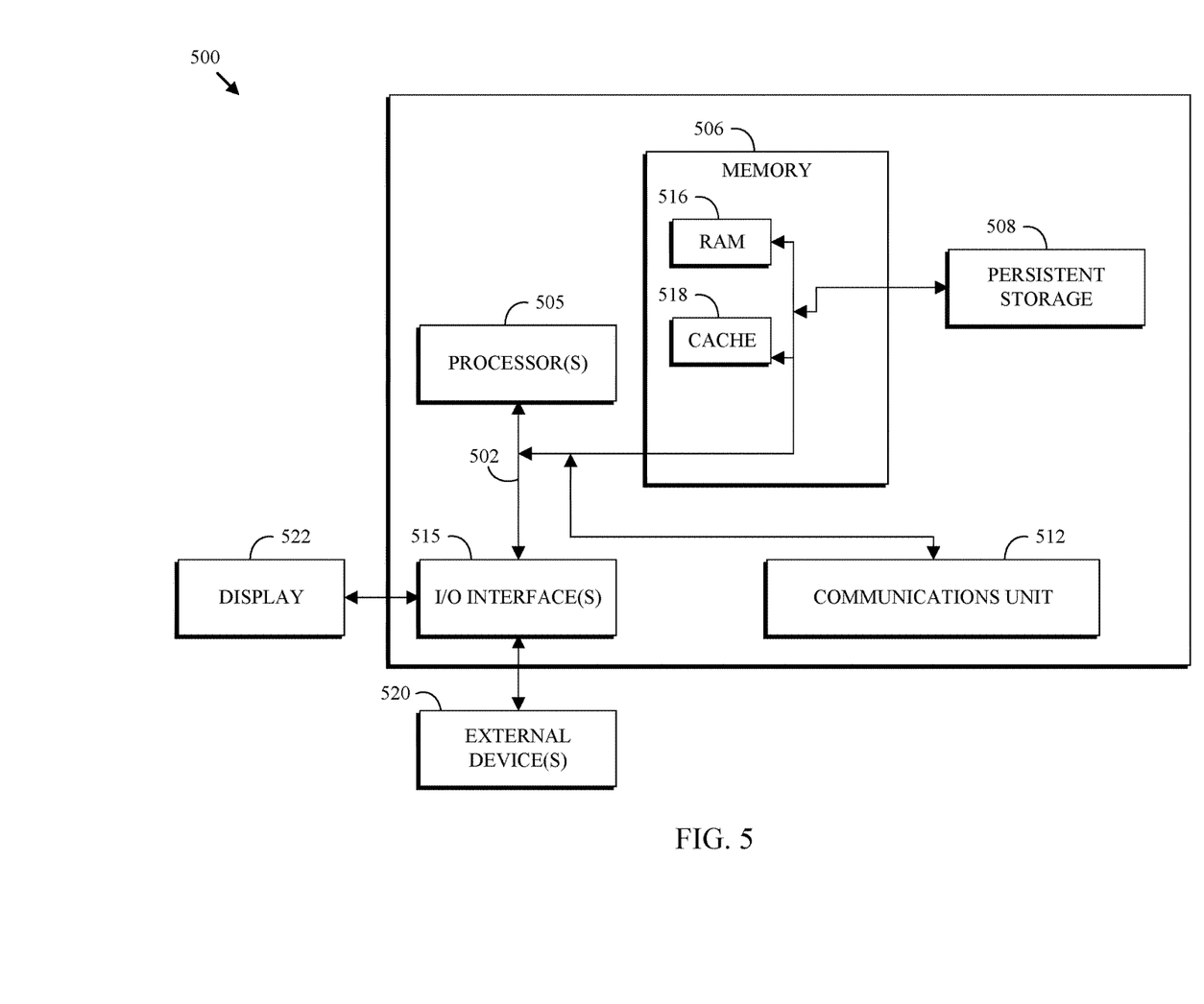
FIG. 5 is a block diagram depicting one example of a computing apparatus (e.g., server) suitable for executing the methods disclosed herein.

FIG. 5 is a block diagram depicting one example of a computing apparatus (i.e., computer 500) suitable for executing the methods disclosed herein. It should be appreciated that FIG. 5 provides only an illustration of one embodiment and does not imply any limitations with regard to the environments in which different embodiments may be implemented. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In the depicted embodiment, memory 506 includes random access memory (RAM) 516 and cache memory 518. In general, memory 506 can include any suitable volatile or non-volatile computer readable storage media.

One or more programs may be stored in persistent storage 508 for execution by one or more of the respective computer processors 505 via one or more memories of memory 506. The persistent storage 508 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 508 via I/O interface(s) 515. I/O interface(s) 515 may also connect to a display 522. Display 522 provides a mechanism to display data to a user and may be, for example, a computer monitor.

One of skill in the art will appreciate that the above disclosed embodiments may be adapted for a variety of environments and applications. Furthermore, the programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method, executed by one or more processors, the method comprising:
   receiving a scan chain design comprising a plurality of parallel scan chains, each parallel scan chain comprising one or more serially connected single-bit registers, each parallel scan chain having a scan chain length; wherein the plurality of parallel scan chains are interspersed with a plurality of stumpmuxes that segment the plurality of parallel scan chains into scan chain segments;
   conducting a determining operation comprising determining a parallel scan chain having a longest scan chain length;
   conducting a swapping operation comprising swapping scan chain segments attached to a selected stumpmux to reduce the longest scan chain length and produce an updated scan chain design; and
   saving the scan chain design.

2. The method of claim 1, further comprising repetitively conducting the determining operation and the swapping operation.

3. The method of claim 2, wherein the determining operation and the swapping operation are repetitively conducted until swapping no longer reduces the longest scan chain length.

4. The method of claim 2, wherein the determining operation and the swapping operation are repetitively conducted until a desired balance is achieved in the scan chain lengths.

5. The method of claim 1, wherein each scan chain segment corresponds to a scan chain type.

6. The method of claim 1, further comprising iterating through a plurality of scan chain types.

7. The method of claim 1, wherein the plurality of scan chain types are prioritized.

8. The method of claim 1, wherein the selected stumpmux is selected by iterating through the stumpmuxes.

9. The method of claim 1, further comprising updating one or more scan chain metrics.

10. A computer product comprising:
    one or more computer readable storage media and program instructions stored on the one or more computer readable storage media, the program instructions comprising instructions to perform a method comprising:
    receiving a scan chain design comprising a plurality of parallel scan chains, each parallel scan chain comprising one or more serially connected single-bit registers, each parallel scan chain having a scan chain length; wherein the plurality of parallel scan chains are interspersed with a plurality of stumpmuxes that segment the plurality of parallel scan chains into scan chain segments;
    conducting a determining operation comprising determining a parallel scan chain having a longest scan chain length;
    conducting a swapping operation comprising swapping scan chain segments attached to a selected stumpmux to reduce the longest scan chain length and produce an updated scan chain design; and
    saving the scan chain design.

11. The computer product of claim 10, wherein the method further comprises repetitively conducting the determining operation and the swapping operation.

12. The computer product of claim 11, wherein the determining operation and the swapping operation are repetitively conducted until swapping no longer reduces the longest scan chain length.

13. The computer product of claim 11, wherein the determining operation and the swapping operation are repetitively conducted until a desired balance is achieved in the scan chain lengths.

14. The computer product of claim 10, wherein each scan chain segment corresponds to a scan chain type.

15. The computer product of claim 10, wherein the method further comprises iterating through a plurality of scan chain types.

16. The computer product of claim 10, wherein the plurality of scan chain types are prioritized.

17. The computer product of claim 10, wherein the selected stumpmux is selected by iterating through the stumpmuxes.

18. A computer system comprising:
    one or more computer processors;
    one or more computer readable storage media and program instructions stored on the one or more computer readable storage media, the program instructions comprising instructions to perform a method comprising:
    receiving a scan chain design comprising a plurality of parallel scan chains, each parallel scan chain comprising one or more serially connected single-bit registers, each parallel scan chain having a scan chain length; wherein the plurality of parallel scan chains are interspersed with a plurality of stumpmuxes that segment the plurality of parallel scan chains into scan chain segments;
    conducting a determining operation comprising determining a parallel scan chain having a longest scan chain length;
    conducting a swapping operation comprising swapping scan chain segments attached to a selected stumpmux to reduce the longest scan chain length and produce an updated scan chain design; and
    saving the scan chain design.

* * * * *